(12) United States Patent
Krippendorf et al.

(10) Patent No.: US 12,494,337 B2
(45) Date of Patent: Dec. 9, 2025

(54) ION IMPLANTATION DEVICE COMPRISING ENERGY FILTER AND ADDITIONAL HEATING ELEMENT

(71) Applicant: mi2-factory GmbH, Jena (DE)

(72) Inventors: Florian Krippendorf, Jena (DE); Constantin Csato, Jena (DE)

(73) Assignee: mi2-factory GmbH, Jena (DE)

( * ) Notice: Subject to any disclaimer, the term of this patent is extended or adjusted under 35 U.S.C. 154(b) by 26 days.

(21) Appl. No.: 17/925,348

(22) PCT Filed: May 14, 2021

(86) PCT No.: PCT/EP2021/062827
§ 371 (c)(1),
(2) Date: Nov. 15, 2022

(87) PCT Pub. No.: WO2021/229054
PCT Pub. Date: Nov. 18, 2021

(65) Prior Publication Data
US 2023/0197398 A1   Jun. 22, 2023

(30) Foreign Application Priority Data

May 15, 2020   (LU) ........................................ 101808

(51) Int. Cl.
*H01J 37/05*   (2006.01)
*H01J 37/317*   (2006.01)
(Continued)

(52) U.S. Cl.
CPC .......... *H01J 37/05* (2013.01); *H01J 37/3171* (2013.01); *H01J 2237/002* (2013.01);
(Continued)

(58) Field of Classification Search
CPC ............. H01L 21/046; H01L 21/31155; H01L 21/265; H01L 21/2652; H01L 21/266;
(Continued)

(56) References Cited

U.S. PATENT DOCUMENTS 4,370,556 A * 1/1983 Stengl ...................... G03F 1/20
250/503.1
5,244,820 A   9/1993 Kamata et al.
(Continued)

FOREIGN PATENT DOCUMENTS

DE   102016106119   * 10/2017
DE   102016110429   * 12/2017
(Continued)

OTHER PUBLICATIONS

International Search Report and the Written Opinion Dated Jul. 30, 2021 From the International Searching Authority Re. Application No. PCT/EP2021/062827. (14 Pages).
(Continued)

*Primary Examiner* — Tabassom Tadayyon Eslami

(57) ABSTRACT

An ion implantation device (20) is provided comprising an energy filter (25) with a structured membrane, wherein the energy filter (25) is heated by absorbed energy from the ion beam, and at least one additional heating element (50*a-d*, 55*a-d*, 60, 70) for heating the energy filter (25).

13 Claims, 5 Drawing Sheets

(51) Int. Cl.
  *H01L 21/04* (2006.01)
  *H05B 3/14* (2006.01)
(52) U.S. Cl.
  CPC ............ *H01L 21/046* (2013.01); *H05B 3/141* (2013.01); *H05B 3/145* (2013.01)
(58) Field of Classification Search
  CPC ............ H01J 37/3171; H01J 2237/057; H01J 2237/3171; H01J 2237/31711; H01J 2237/31701; G21K 1/10; G02B 6/1347; C03C 23/0055
  See application file for complete search history.

(56) References Cited

U.S. PATENT DOCUMENTS

| 2014/0345522 | A1 | 11/2014 | Kabasawa |
| 2015/0037983 | A1 | 2/2015 | Bernhardt et al. |
| 2019/0122850 | A1 | 4/2019 | Krippendorf et al. |
| 2019/0257209 | A1 | 8/2019 | Krippendorf et al. |
| 2019/0267209 | A1* | 8/2019 | Krippendorf ......... H01L 21/046 |
| 2019/0304820 | A1 | 10/2019 | Baggett et al. |

FOREIGN PATENT DOCUMENTS

| DE | 102016015822 | * | 3/2019 |
| DE | 102016015823 | * | 11/2019 |
| DE | 102019120623 | | 2/2021 |
| EP | 0014516 | | 3/1983 |
| JP | 2014-229599 | | 12/2014 |
| WO | WO 2019/164614 | | 8/2019 |

OTHER PUBLICATIONS

Search Report and Written Opinion Dated Jan. 27, 2021 From Le Gouvernement du Grand-Duché de Luxembourg, Ministère de l'Économie Re. Application No. LU101808. (11 Pages).

* cited by examiner

ION IMPLANTATION DEVICE COMPRISING ENERGY FILTER AND ADDITIONAL HEATING ELEMENT

RELATED APPLICATIONS

This application is a National Phase of PCT Patent Application No. PCT/EP2021/062827 having International filing date of May 14, 2021, which claims the benefit of priority of Luxembourg Patent Application No. LU101808 filed on May 15, 2020. The contents of the above applications are all incorporated by reference as if fully set forth herein in their entirety.

FIELD OF THE INVENTION

The invention relates to an apparatus for ion implantation device comprising an energy filter (implantation filter) for ion implantation and its use and to an implantation method.

FIELD AND BACKGROUND OF THE INVENTION

Ion implantation is a method to achieve the doping or production of defect profiles in a material, such as semiconductor material or an optical material, with predefined depth profiles in the depth range of a few nanometers to several tens of micrometers. Examples of such semiconductor materials include, but are not limited to silicon, silicon carbide, gallium nitride, gallium arsenide, cadmium telluride, zinc selenide. Examples of such optical materials include, but are not limited to, $LiNbO_3$, quartz glass, or potassium titanyl phosphate, as well as polymer such as PMMA.

There is a need to produce depth profiles for the ion implantation which have a wider depth distribution than that of a doping concentration peak or defect concentration peak obtainable by monoenergetic ion irradiation, or to produce doping or defect depth profiles which cannot be produced by one or a few simple monoenergetic implantations. Prior art methods are known for producing the depth profile use a structured energy filter in which the energy of a monoenergetic ion beam is modified as the monoenergetic ion beam passes through a micro-structured energy filter component. The resulting energy distribution leads to a creation of the depth profile ions the material. This is described, for example, in European Patent Nr. 0 014 516 B1 (Bartko).

An example of such an ion implantation device 20 is shown in FIG. 1 in which an ion beam 10 impacts a structured energy filter 25 in a vacuum housing. The ion beam source 5 could be, for example, a high-frequency linear accelerator producing ions with an energy of 0.3 to 3.0 MeV/ion, but this is not limiting of the invention. The ion beam source 5 could also be a cyclotron, a tandem accelerator, or a single-ended-electrostatic accelerator. In other aspects, the energy of the ion beam source 5 is between 0.5 and 3.0 MeV/nucleon or preferably between 1.0 and 2.0 MeV/nucleon. In one specific embodiment, the ion beam source produces an ion beam 10 with an energy of between 1.3 and 1.7 MeV/nucleon. The total energy of the ion beam 10 is between 1 and 50 MeV, in one preferred aspect, between 4 and 40 MeV, and in a preferred aspect between 8 and 30 MeV. The frequency of the ion beam 10 could be between 1 Hz and 2 kH, for example between 3 Hz and 500 Hz and, in one aspect, between 7 Hz and 200 Hz. The ion beam 10 could also be a continuous ion beam 10. Examples of the ions in the ion beam 10 include, but are not limited to aluminum, nitrogen, hydrogen, helium, boron, phosphorous, carbon, arsenic, and vanadium.

In FIG. 1 it will be seen that the energy filter 25 is made from a membrane having a triangular cross-sectional form on the right-hand side, but this type of form is not limiting of the invention and other cross-sectional forms could be used. The upper ion beam 10-1 passes through the energy filter 25 with little reduction in energy because the area $25_{min}$ through which the upper ion beam 10-1 passes through the energy filter 25 is a minimum thickness of the membrane in the energy filter 25. In other words, if the energy of the upper ion beam 10-1 on the left-hand side is E1 then the energy of the upper ion beam 10-1 will have substantially the same value E1 on the right-hand side (with only a small energy loss due to stopping power of the membrane which leads to absorption of at least some of the energy of the ion beam 10 in the membrane).

On the other hand, the lower ion beam 10-2 passes through an area $25_{max}$ in which the membrane of the energy filter 25 is at its thickest. The energy E2 of the lower ion beam 10-2 on the left-hand side is absorbed substantially by the energy filter 25 and thus the energy of the lower ion beam 10-2 on the right-hand side is reduced and is lower than the energy of the upper ion beam, i.e. E1>E2. The result is that the more energetic upper ion beam 10-1 is able to penetrate a greater depth in the substrate material 30 than the less energetic lower ion beam 10-2. This results in a differential depth profile in the substrate material 30, which is part of a wafer.

This depth profile is shown on the right-hand side of the FIG. 1. The hashed triangular area shows that the ions penetrate the substrate material at a depth between d1 and d2. The Gaussian curve shows the depth profile without an energy filter 25 and having a maximum value at a depth of d3. It will be appreciated that the depth d3 is larger than the depth d2 since some of the energy of the ion beam 10-1 is absorbed in the energy filter 25.

In the prior art there are a number of principles known for the fabrication of the energy filter 25. Typically, the energy filter 25 will be made from bulk material with the surface of the energy filter 25 etched to produce the desired pattern, such as the triangular cross-sectional pattern known from FIG. 1. In German Patent No DE 10 2016 106 119 B4 (Csato/Krippendorf) an energy filter was described which was manufactured from layers of materials which had different ion beam energy reduction characteristics. The depth profile resulting from the energy filter described in the Csato/Krippendorf patent application depends on the structure of the layers of the material as well as on the structure of the surface.

A further construction principle is shown in the Applicant's co-pending application DE 10 2019 120 623.5, the details of which are incorporated herein by reference, in which the energy filter comprises spaced micro-structured layers which are connected together by vertical walls.

The maximum power from the ion beam 10 that can be absorbed in the energy filter 25 depends on three factors: the effective cooling mechanism of the energy filter 25, the thermo-mechanical properties of the membrane from which the energy filter 25 is made, as well as the choice of material from which the energy filter 25 is made is also relevant. In a typical process, around 50% of the power is absorbed in the energy filter 25, but this can rise to 80% depending on the process conditions.

An example of the energy filter is shown in FIG. 2 in which the energy filter 25 is made of a triangular structured membrane mounted in a frame 27. In one non limiting example the energy filter 25 can be made from a single piece of material, for example, silicon on insulator which comprises an insulating layer silicon dioxide layer 22 having, for example a thickness of 0.2-1 µm sandwiched between a silicon layer 21 (of typical thickness between 2 and 20 µm, but up to 200 µm) and bulk silicon 23 (around 400 µm thick). The structured membrane is made, for example, from silicon, but could also be made from silicon carbide or another carbon-based materials or a ceramic.

In order to optimize the wafer throughput in the ion implantation process for a given ion current for the ion beam 10 and thus use the ion beam 10 efficiently, it is preferred to only irradiate the membrane of the energy filter 25 and not the frame 27 in which the membrane is held in place. In reality, it is likely that at least part of the frame 27 will also be irradiated by the ion beam 10 and thus heat up. It is indeed possible that the frame 27 is completely irradiated. The membrane forming the energy filter 25 is heated up but has a very low thermal conductivity as the membrane is thin (i.e. between 2 and 20 µm, but up to 200 µm). The membranes are between 2×2 cm$^2$ and 35×35 cm$^2$ in size and correspond to the size of the wafers. There is little thermal conduction between the membranes and the frame 27. Thus, the monolithic frame 27 does not contribute to the cooling of the membrane and the only cooling mechanism for the membrane which is relevant is the thermal radiation from the membrane.

The heating of the membrane in the energy filter 25 results in addition to thermal stress between the heated parts of the membrane forming the energy filter 25 and the frame 27. This is illustrated in FIG. 3B which shows that due to the different thermal capacities of the membrane and the frame 27, the smaller membrane heats up much faster than the bulkier frame. This difference results in thermal stress between the membrane and filter which can lead to mechanical deformation.

Furthermore, the localized heating of the membrane due to absorption of energy from the ion beam in only parts of the membrane also results in thermal stress within the membrane and can lead to mechanical deformation or damage to the membrane in the energy filter 25. The heating of the membrane also occurs within a very short period of time, i.e. less than a second and often in the order of milliseconds. The cooling effect on the non-irradiated portions of the energy filter will lead to temperature gradients within the energy filter 25. This cooling effect is particularly noticeable for pulsed ion beams 10 and scanned ion beams 10. These temperature gradients can lead to defects and formation of separate phases within the material from which the membrane of the energy filter 25 is made, and even to unexpected modification of the material (due to the implanted species).

It has also been found that the energy filter 25 heats up due to the ion beam 10 much more quickly when the temperature of the energy filter is less than 200° C.-400° C. and is illustrated in FIG. 3A. FIG. 3A shows an example of the temperature in ° C. dependence on particle current density during a continuous irradiation for absorption of ions with different energies. The continuous lines show simulations for ion of 2 MeV energy and the upper line for ions of 8 MeV energy. The intermediate lines are for ions of 4 MeV and 6 MeV as indicated on FIG. 3A. The example shown in FIG. 3A is merely exemplary and will depend on the design of the filter and the process conditions.

SUMMARY OF THE INVENTION

This document teaches an ion implantation device comprising an energy filter in which the energy filter is to add an additional heating element to the energy filter. The addition of the additional heating element is to pre-heat the energy filter to reduce the temperature gradients resulting from the ion beam passing through energy filter.

The additional heating element can be in one aspect a resistive element connected by electrical contacts to an electrical conductor. The current flows through bulk silicon forming the frame of the energy filter and/or through the membrane of the energy filter and heats the material.

In another aspect, the additional heating element energy is an external heating element, such as but not limited to, a heatable chuck or an external light source mounted in a housing.

This document also describes a method of implanting ions in a substrate material with an ion depth profile. The method outlined in this document comprises pre-heating an energy filter to at least a predetermined temperature, directing an ion beam through the energy filter to the substrate material for a pre-determined length of time, and subsequently cooling the energy filter.

The pre-heating of the energy filter can comprises pre-heating separately of at least part of a membrane in the energy filter or part of a frame of the energy filter and is carried out by using an additional heating element, such a resistive element, an external lamp, or a heatable chuck on which the substrate material is mounted.

DESCRIPTION OF SPECIFIC EMBODIMENTS OF THE INVENTION

The invention will now be described on the basis of the drawings. It will be understood that the embodiments and aspects of the invention described herein are only examples and do not limit the protective scope of the claims in any way. The invention is defined by the claims and their equivalents. It will be understood that features of one aspect or embodiment of the invention can be combined with a feature of a different aspect or aspects and/or embodiments of the invention.

Figure 3A:
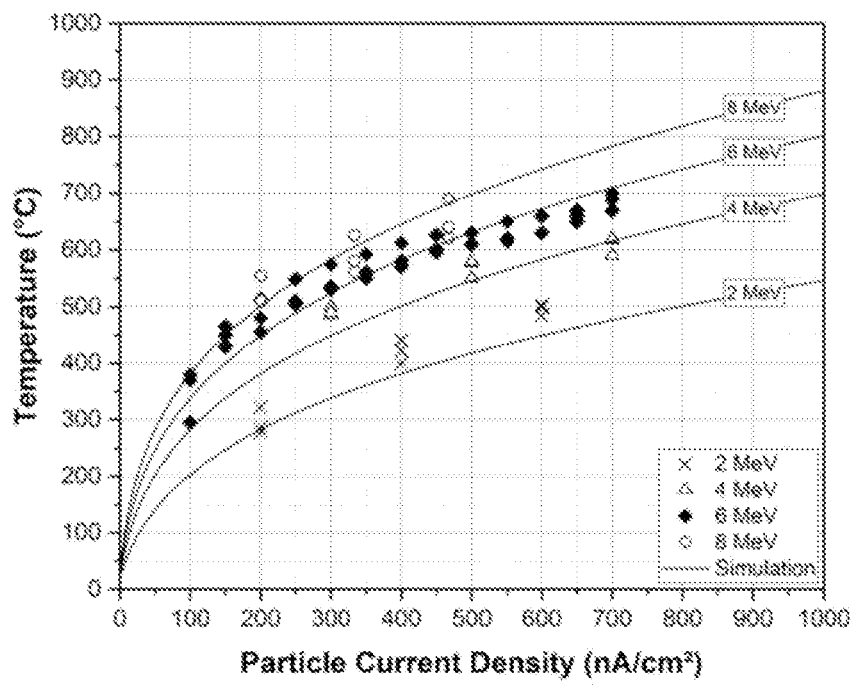
FIG. 3A shows the temperature dependence of the filter with increasing ion current density.

FIGS. 4A-D show three examples of an energy filter 25 in a housing with heating elements. The energy filters 25 illustrated use the same reference numerals to show the same elements as in FIG. 1. The heating elements are used to heat up the energy filter 25 before, during and after the use of the energy filter 25 for ion implantation. It can be seen from considering FIG. 3A that the additional energy dissipated in the energy filter 25 due to the ion implantation beam 10 is much smaller at higher temperatures (e.g. above around 200 to 400° C.). This means that the temperature difference between the irradiated parts of the energy filter 25 and the unirradiated parts of the energy filter 25 will be generally less than 50-200° C. which results in much lower thermal stress in the energy filter 25.

Figure 4A:
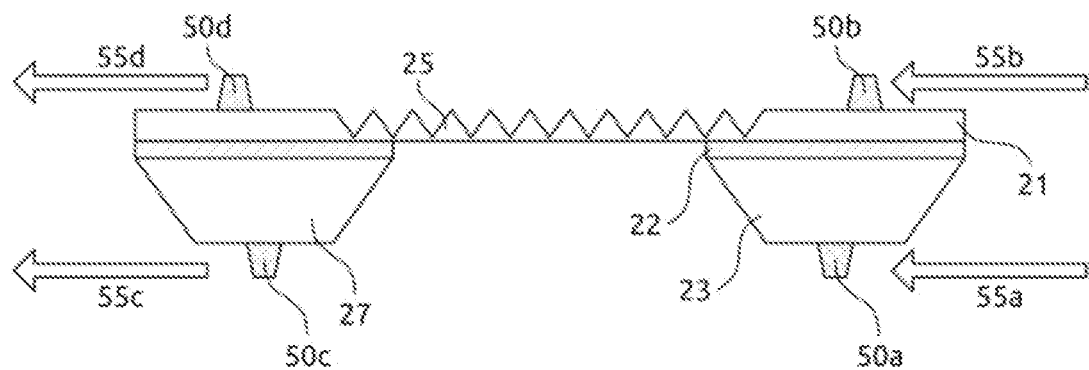
FIGS. 4A-4E show five embodiments of the energy filter with a heating element.

FIG. 4A illustrates one example of the heating element. In this example, the heating element is due to the resistive heating of the frame 27 in which the energy filter 25 is mounted as well as the membrane. In this example, contacts 50a and 50c are mounted connected to the bulk silicon layer 23 and a current flows from electrical conductor 55a to electrical conductor 55c (or vice versa) through the frame 27 and the frame 27 warms up due to the electrical resistance of the material in the frame 27, i.e. the bulk silicon 23, contacts 50b and 50d are connected to corresponding electrical conductors 55b and 55d as seen in this figure. A current flows from the electrical contact 50b to the electrical contact 50d (or vice versa) through the membrane formed from the silicon layer 21 and the membrane warms up due to the electrical resistance of the material in the silicon layer 21.

Figure 3B:
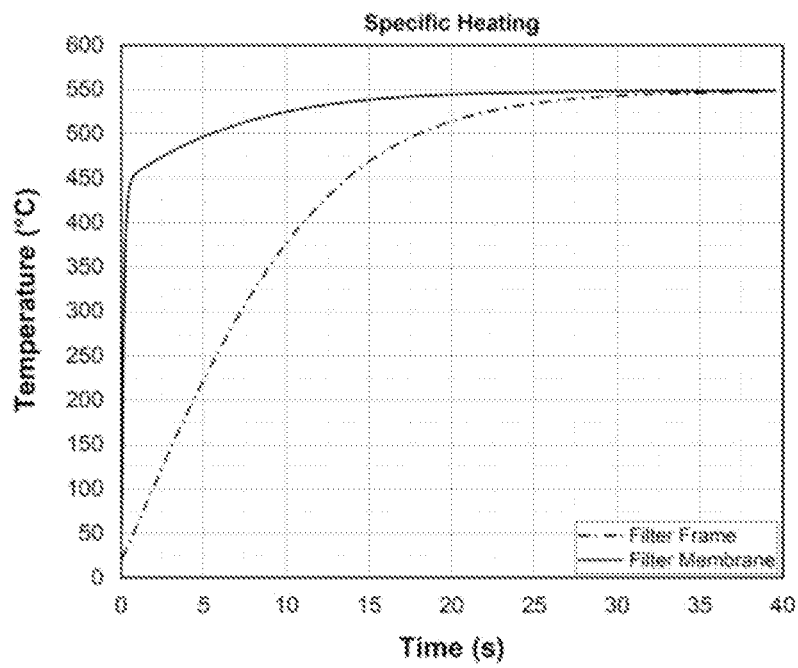
FIG. 3B shows the difference in temperature rise between the membrane and the filter as a function of time.
Figure 4B:
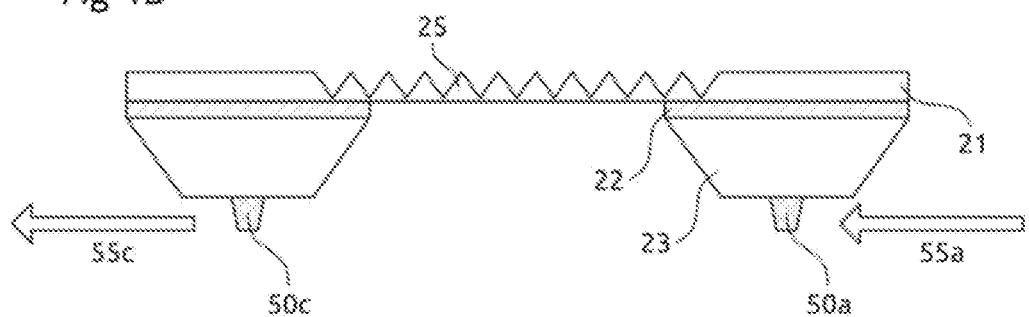

In the example shown in FIG. 4B, resistive heating is also used to warm up the frame 27. In this case, there are no electrical contacts 50b or 50d applied to the silicon layer 21. The resistive heating of the bulk silicon 23 is identical to the example of FIG. 4A. In this example, no current passes through the membrane FIG. 3B shows that the frame 27 heats up more slowly than the membrane and thus there may be no need to separately heat the membrane.

Figure 4C:
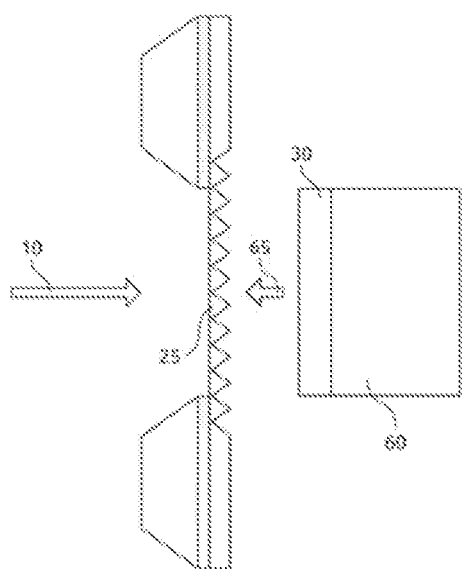

The example shown in FIG. 4C does not use resistive heating of the energy filter 25 or the frame 27 but uses the principle of thermal radiation from a heatable chuck 60 on which the substrate material 30 has been placed. The thermal radiation from the heatable chuck 60 was radiated toward the membrane of the energy filter 25 as indicated by the arrow 65. In this example, either the energy filter 25 alone could be heated up or the combination of the energy filter 25 and the frame 27 could be heated.

Figure 4D:
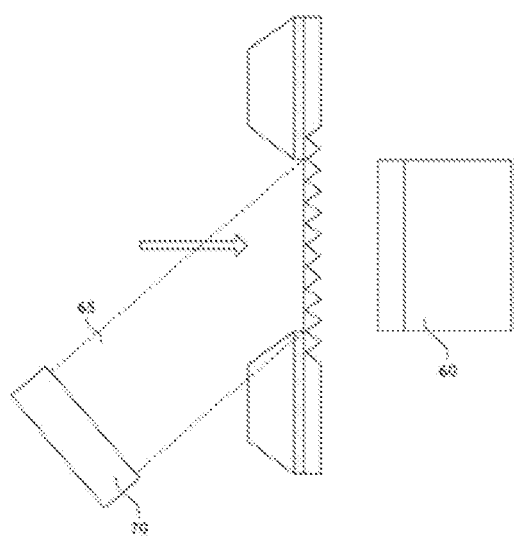

A similar principle is employed in the example shown in FIG. 4D. In this case, a light source 70, such as a thermal lamp or a laser, is placed proximate to the energy filter 25 which radiates thermal radiation towards the energy filter 25 to heat up the energy filter 25. The light source 70 could also be located outside of the housing and radiate through a window in the housing. It will be appreciated that FIG. 4D only shows a single one of the light sources 70, but there could be multiple light sources 70 to enable uniform heating of the energy filter 25. There could also be different ones of the light sources 70 on different sides of the energy filter 25.

Figure 4E:
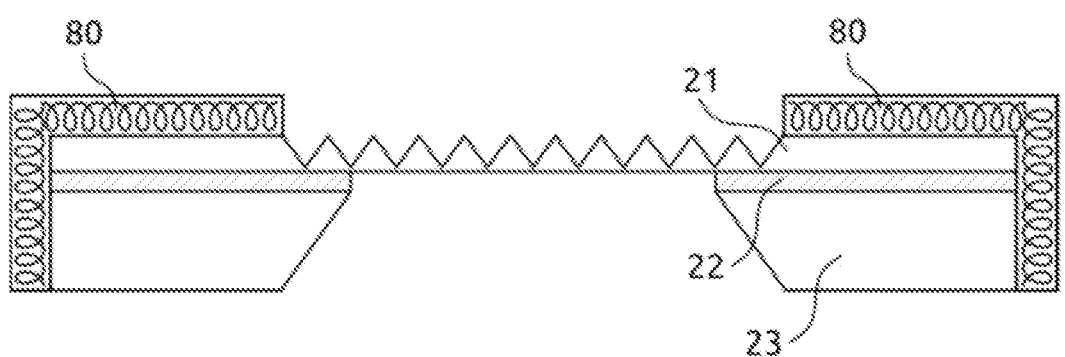

In a further example, shown in FIG. 4E, separate heating elements 80 are placed about the frame 27 to heat the frame 27 separately.

The additional heating elements and their geometry shown in FIGS. 4A-4E are not limiting of the invention and other heating elements and geometries could be employed to heat up the energy filter 25 in order to reduce the localized temperature differences in the membrane of the energy filter 25. This reduces the thermal stress in the energy filter 25 and thus increases the lifetime of the energy filter 25. It will be appreciated that it would be possible to combine two or more of the different heating elements.

It will be appreciated that heating the energy filter 25 could lead to changes in the properties of the energy filter 25 due to annealing of defects or the diffusion out of gas particles which were trapped in the membrane material of the energy filter 25. Annealing can be beneficial in that defects are healed. It would be possible to change the properties can be minimized by heating the energy filter 25 very quickly (around several milliseconds) and then cooling the energy filter 25 after the ion beam 10 is switched off. In this case, any defects induced in the material of the membrane of the energy filter 25 would not have time to move to energy-favorable positions within the membrane material and will be effectively "frozen" within the membrane material of the energy filter 25. On the other hand, if defects are to be cured then it may be necessary to heat the energy filter 27 more slowly or keep the energy filter 27 at an elevated temperature for a longer time. The additional heating elements shown in FIGS. 4A-4E enable the differential temperature profiles for heating up the energy filter 27 to be created.

The energy filter 25 is created from a bulk material or by depositing material on a substrate. There are a number of methods known in the art. For example, a mask can be created on the substrate using patterning techniques such as photolithography, e-beam lithography, or laser-beam lithography. The mask is made of a photoresist, silicon dioxide, silicon carbide, chromium, or other materials. Wet chemical etching techniques use, for example, potassium hydroxide, TMAH (tetramethylammonium hydroxide), and other anisotropic etching solutions, plasma-etching techniques, and ion-beam etching.

Figure 5:
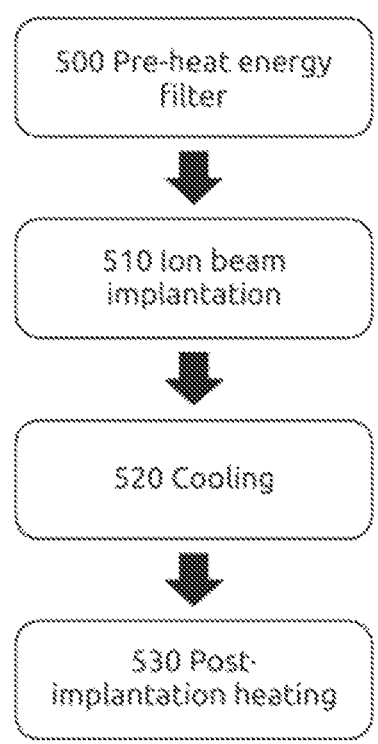
FIG. 5 shows the method of ion implantation.

A method for implantation of ions from the ion beam source 5 into the substrate material 30 to provide a deposition profile, similar to that illustrated with respect to FIG. 1. will now be described with reference to FIG. 5. In a first step 500, the energy filter 25 was pre-heated to at least a predetermined temperature. The pre-determined temperature was preferably chosen such that the rise in temperature of the energy filter 25 due to the passage of the ion beam 10 (see FIG. 3) is reduced. The predetermined temperature could be in the range of 200° C. to 500° C. (or 400° C. in other aspects), for example, but this is not limiting of the invention. It would also be possible to heat different parts of the energy filter 25 differentially.

Figure 1:
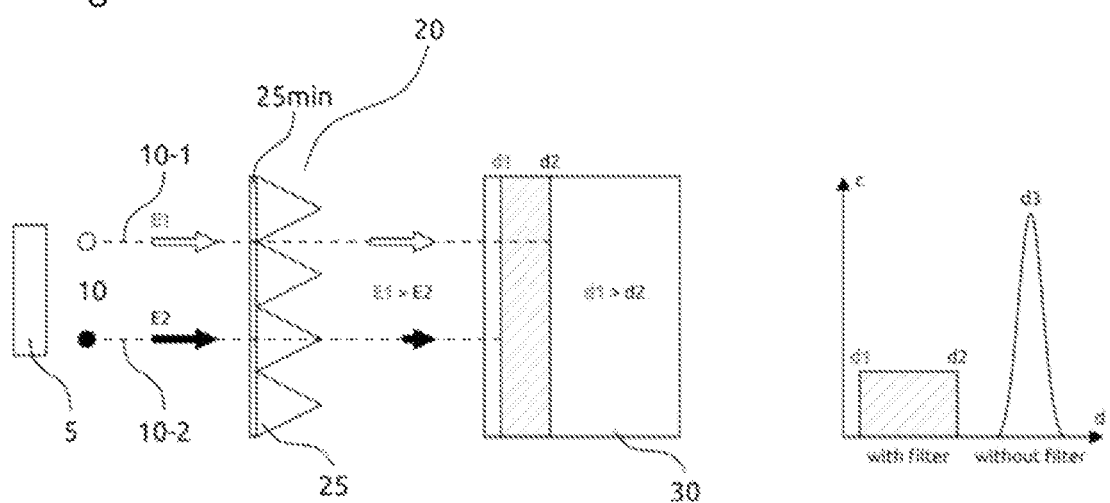
FIG. 1 shows the principle of the ion implantation device with an energy filter as known in the prior art.
Figure 2:
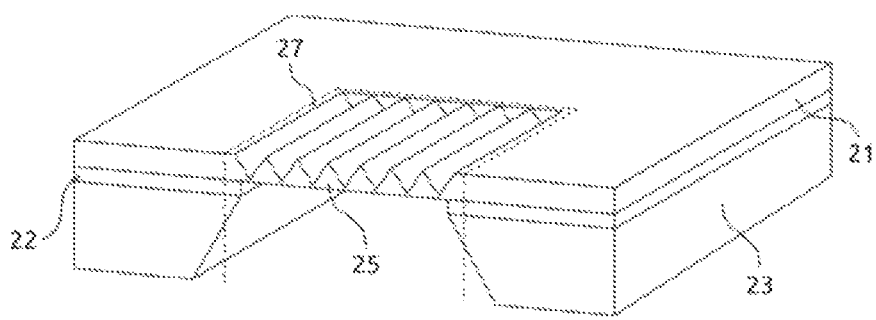
FIG. 2 a structure of the ion implantation device with the energy filter.

The ion beam 10 is directed in step 510 through the energy filter 25 to the substrate material 30 for a predetermined length of time to implant ions into the substrate material 30, as shown in FIG. 1. The energy filter 25 can also be heated during this stage to reduce temperature gradients within the energy filter 25 (including the membrane and the frame 27 or between the membrane and the frame). Finally, the energy filter 25 is cooled in step 520. The pre-heating step 500 and the cooling step 520 do not have to be carried out uniformly. As noted above, it is possible to design different temperature profiles if required.

In one aspect, the cooling of the energy filter 25 is carried out by thermal radiation. It would also be possible to use a cooling fluid in the energy filter 25 or the housing of the ion implantation device to cool the energy filter 25 more rapidly. The cooling of the energy filter 25 is taught, for example, in the Applicant's own patent application No. LU101807 filed concurrently.

In a further aspect, the energy filter 25 can be heated in step 530 subsequently after the implantation process is completed, i.e. after the ion beam 10 is removed, to a temperature between, for example, 500° C. to 1100° C. for annealing a silicon membrane to remove defects in the energy filter 25 caused by the ion beam 10. This post-implantation heating step 530 can be carried out in the ion implantation device or the energy filter 25 can be removed from the ion implantation device. This post implantation heating step 530 can be carried out either after every implantation run, after a certain dosage value per unit area has been reached, or at regular time intervals. The post-implantation heating step 530 is, in one aspect, a rapid thermal processing step in order to minimize plastic deformation of the membrane.

REFERENCE NUMERALS

5 Ion beam source
10 Ion Beam
20 Ion implantation device
21 Silicon layer
22 Silicon dioxide layer
23 Bulk silicon
25 Energy filter
27 Filter Frame
30 Substrate material
50 Electrical contacts
55 Electrical conductor
60 Chuck
65 Thermal radiation
70 Light source
80 Heating elements

The invention claimed is:

1. A method of implanting ions in a substrate material with an ion depth profile comprising:
pre-heating an energy filter to at least a predetermined temperature, wherein the energy filter comprises a structured membrane;
after the energy filter is preheated to the predetermined temperature, directing an ion beam through the energy filter to the substrate material for a pre-determined length of time; and
cooling the energy filter after the pre-determined length of time.

2. The method of claim 1, wherein the cooling of the energy filter is carried out by thermal radiation.

3. The method of claim 2, wherein the pre-heating of the energy filter comprises pre-heating separately of at least part of a membrane in the energy filter or part of a frame of the energy filter.

4. The method of claim 1 wherein the pre-heating of the energy filter comprises pre-heating separately of at least part of a membrane in the energy filter or part of a frame of the energy filter.

5. The method of claim 1, wherein the pre-heating of the energy filter is carried out using a temperature profile.

6. The method of claim 1, wherein different parts of the energy filter are heated differently.

7. The method of claim 1, wherein at least parts of the energy filter are heated during the directing of the ion beam on the energy filter.

8. The method of claim 1, wherein the energy filter is configured to produce a predefined differential ion depth profile in the substrate material.

9. The method of claim 8, wherein the predefined differential ion depth profile has a depth range of few nanometers to several tens of micrometers.

10. The method of claim 1, wherein the pre-heating of the energy filter is carried out using an additional heating element.

11. The method of claim 10, wherein the additional heating element is one of a resistive element an external lamp, or a heatable chuck on which the substrate material is mounted.

12. The method of claim 1, further comprising a post-implantation heating step.

13. The method of claim 12, wherein the post-implantation heating step is performed in a separate location.

* * * * *